(12) United States Patent
Inoue

(10) Patent No.: US 6,933,210 B2
(45) Date of Patent: Aug. 23, 2005

(54) METHOD OF MANUFACTURING SEMICONDUCTOR DEVICE, INTEGRATED CIRCUIT, ELECTRO-OPTICAL DEVICE, AND ELECTRONIC APPARATUS

(75) Inventor: Satoshi Inoue, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/814,169

(22) Filed: Apr. 1, 2004

(65) Prior Publication Data

US 2004/0241934 A1 Dec. 2, 2004

(30) Foreign Application Priority Data

Apr. 10, 2003 (JP) ........................................ 2003-107071

(51) Int. Cl.⁷ .......................... H01L 21/30; H01L 21/46
(52) U.S. Cl. ........................ 438/455; 438/197; 438/381
(58) Field of Search ................................ 438/455, 197, 438/381, 382, 383, 712, 795, 979, 983

(56) References Cited

U.S. PATENT DOCUMENTS

| | | | | |
|---|---|---|---|---|
| 5,466,631 A | * | 11/1995 | Ichikawa et al. | 438/406 |
| 5,546,375 A | * | 8/1996 | Shimada et al. | 369/126 |
| 6,523,236 B1 | * | 2/2003 | Nishikawa et al. | 29/890 |

FOREIGN PATENT DOCUMENTS

WO   WO 03/010825 A1   2/2003

OTHER PUBLICATIONS

"Single Crystal Thin Film Transistors", *IBM Technical Disclosure Bulletin*, Aug. 1993, p. 257.

R. Ishihara et al., "Advanced Excimer–Laser Crystallization Techniques of Si Thin–Film For Loacation Control of Large Grain on Glass", proc. SPIE 2001, vol. 4295, pp. 14–23.

* cited by examiner

*Primary Examiner*—David Nhu
(74) *Attorney, Agent, or Firm*—Oliff & Berridge, PLC

(57) ABSTRACT

The invention provides a technique of allowing fine and high-performance thin film semiconductor elements to be easily formed on a large-sized substrate. A method of manufacturing a semiconductor device includes: forming a peeling layer on a first substrate; forming an insulating film on the peeling layer; forming a plurality of fine holes in the insulating film; forming a semiconductor film on the insulating film and in the fine holes; melting and crystallizing the semiconductor film by a heat treatment to form a crystalline semiconductor film including substantially single-crystalline grains centered substantially on the respective fine holes; forming a semiconductor element T by using the crystalline semiconductor film; and causing peeling at the inside and/or the boundary surface of the peeling layer to separate the semiconductor element T from the first substrate and transferring the semiconductor element to a second substrate.

17 Claims, 11 Drawing Sheets

METHOD OF MANUFACTURING SEMICONDUCTOR DEVICE, INTEGRATED CIRCUIT, ELECTRO-OPTICAL DEVICE, AND ELECTRONIC APPARATUS

BACKGROUND OF THE INVENTION

1. Field of Invention

The present invention relates to a semiconductor device and a manufacturing method thereof, and specifically to a technique of forming semiconductor elements, which have excellent performance and which employ a substantially single-crystalline semiconductor film, on a large-sized substrate.

2. Description of Related Art

A related art method of manufacturing a thin film semiconductor transistor represented by a polycrystalline silicon thin film transistor (p-SiTFT) at a relatively low temperature includes a method of manufacturing a thin film transistor by heating an amorphous silicon film with a laser to form a polycrystalline silicon film, forming a gate electrode out of the polycrystalline silicon film as a semiconductor film, and forming interconnections out of a metal thin film. However, in this method, since it is difficult to control energy of the laser beam and deviation occurs in a feature of the semiconductor film to be manufactured, a technique of growing a substantially single-crystalline silicon film without causing the above problem, in place of the polycrystalline silicon film, has been suggested in the related art. This technique is described in a document entitled "Single Crystal Thin Film Transistors", IBM TECHNICAL DISCLOSURE BULLETIN, August 1993, pp. 257–258, or a document entitled "Advanced Excimer-Laser Crystallization Techniques of Si Thin-Film For Location Control of Large Grain on Glass", R. Ishihara et al., proc. SPIE 2001, vol. 4295, p. 14–23.

In theses documents, it is disclosed that fine holes (grain filters) are formed in an insulating film on a substrate. An amorphous silicon film is formed on the insulating film and in the fine holes. A laser is then applied to the amorphous silicon film, the amorphous silicon in bottom portions of the fine holes is held to be in a non-melted state and the amorphous silicon in portions other than the bottom portion is made to be in a melted state. Crystal growth using the amorphous silicon held in a non-melted state as crystal nucleuses is caused, thereby forming the substantially single-crystalline silicon film.

SUMMARY OF THE INVENTION

In a case of employing the technique of forming the substantially single-crystalline silicon film described above, it is necessary to form a plurality of fine holes as seeds of the melt and crystallization of the semiconductor film on the substrate. However, it is not easy to form the plurality of fine holes uniformly and efficiently. This disadvantage becomes prominent specifically with an increase of a substrate size. It is preferable that miniaturization is further advanced in a thin film transistor, but there is also a problem that the fine patterning is not easy with an increase of substrate size.

Therefore, the present invention provides a technique of allowing fine and high-performance thin film semiconductor elements to be easily formed on a large-sized substrate.

In order to accomplish the above, an aspect of the present invention provides a method of manufacturing a semiconductor device, the method including forming a peeling layer on a first substrate; forming an insulating film on the peeling layer; forming a plurality of fine holes in the insulating film; forming a semiconductor film on the insulating film and in the fine holes; a crystallization step of melting and crystallizing the semiconductor film by a heat treatment to form a crystalline semiconductor film including substantially single-crystalline grains centered substantially on the respective fine holes; an element forming step of forming a semiconductor element by using the crystalline semiconductor film; and a transfer step of causing peeling at the inside and/or the boundary surface of the peeling layer to separate the semiconductor element from the first substrate and transferring the semiconductor element to a second substrate.

In this method, the crystalline semiconductor film is formed on the first substrate, a semiconductor element is formed using the semiconductor film. Then the semiconductor element is transferred (moved) to the second substrate (final substrate). Accordingly, since a substrate having conditions (shape, size, physical characteristics) convenient to form the crystalline semiconductor film or forming elements thereafter can be used as the first substrate, it is possible to form fine and high-performance semiconductor elements on the first substrate. The second substrate can be formed to have a large area without restriction of element forming process. A desired substrate can be selected and used from wide options, such as inexpensive substrates made of synthetic resin or soda glass, or flexible plastic films. Therefore, it is possible to form the fine and high-performance thin film semiconductor elements on a large-sized substrate with ease (at low cost).

In an aspect of the present invention, the "substantially single-crystalline" includes a case where crystal grains are single, and in addition, a case where the crystal grains are close to single. Specifically, a case where when a plurality of crystals are combined, the number of crystals is small and the semiconductor film including the crystal grains has features equal to those of a semiconductor thin film formed out of mono-crystals from the view point of features of a semiconductor thin film. Further, the "semiconductor element" refers to general elements formed by using the crystalline semiconductor film according to an aspect of the present invention, and includes active elements and passive elements in addition to a transistor, a diode, a resistor, an inductor and a capacitor. The semiconductor elements may be formed using portions not including the fine holes of the crystalline semiconductor film.

Since portions having poor crystalline properties may be formed in the vicinity of the fine holes, it is possible to further enhance of characteristics by forming the semiconductor elements without including the portions.

The transfer step may include: bonding the semiconductor element on the first substrate to the second substrate; applying energy to the peeling layer to cause the peeling at the inside and/or the boundary surface of the peeling layer; and separating the first substrate from the second substrate. As a result, it is possible to perform the element transfer easily and surely.

The transfer step may also include: bonding the semiconductor element on the first substrate to a temporary transfer substrate; causing the peeling at the inside and/or the boundary surface of the peeling layer; separating the first substrate from the temporary transfer substrate; bonding the semiconductor element on the temporary transfer substrate to the second substrate; and separating the temporary transfer substrate from the second substrate. In this case, since the upper and lower structural relationship of the semiconductor element formed on the first substrate reappears on the second substrate, related art techniques, such as designs of element structure or manufacturing processes can be used almost without change, and thus it is convenient.

The application of energy to the peeling layer may be carried out by laser irradiation. As a result, it is possible to efficiently carry out the application of energy.

The first substrate may have at least one of size, shape and thermal resistance suitable for a semiconductor process capable of processing at least a semiconductor wafer. In an aspect of the present invention described above, since the first can be selected with high degree of freedom regardless of the second substrate, the first substrate can be formed to use the related art semiconductor processes. As a result, a high-temperature processing or a fine patterning can be carried out thereto, so that it is possible to form a semiconductor element with high reliability and high performance. In general, the first substrate may be expensive. But since the first substrate can be repeatedly used in an aspect of the present invention, increase of the manufacturing cost can be avoided, so that it is possible to use expensive material such as quartz, glass, etc. Further, by employing the semiconductor process, it is easy to miniaturize the semiconductor elements. As the semiconductor process, an LSI manufacturing process may be employed.

Furthermore, the first substrate may have a wafer size. Here, the "wafer size" refers to a substrate has shape, thickness, size, etc. substantially equal to a semiconductor wafer used for a related art semiconductor process. As a result, it is possible to easily apply the first substrate according to an aspect of the present invention to the related art semiconductor process.

Furthermore, the surface roughness of the first substrate may range from 10 µm to 30 µm. As a result, it is easier to finely process the semiconductor elements.

In the element forming step described above, a plurality of the semiconductor elements may be formed using one crystalline semiconductor film. In this case, the semiconductor elements may be formed not to include crystal grain boundaries existing in the crystalline semiconductor films. Furthermore, the semiconductor elements may be formed not to include the crystalline semiconductor film adjacent to the fine holes as seeds of the melt and crystallization. As a result, it is possible to obtain high-performance semiconductor elements without influence from the crystal grain boundaries, etc. One semiconductor element may be formed using one crystalline semiconductor films, and one semiconductor element may be formed using a plurality of crystalline semiconductor films.

A unit circuit including the semiconductor elements may be constructed by properly providing interconnections among the semiconductor elements. Here, the "unit circuit" refers to circuit as a minimum unit having a predetermined function and including two or more semiconductor elements, such as a complementary circuit (CMOS circuit), a pixel circuit of an electro-optical device such as an organic EL display device, etc. As a result, a fine thin film circuit can be formed with a high density on the second substrate on which it is difficult to form such circuits.

In the transfer step described above, only the semiconductor elements that are transfer targets among the plurality of semiconductor elements formed on the first substrate may be selectively transferred from the first substrate to the second substrate. Accordingly, it is possible to dispersively transfer the respective semiconductor elements formed intensively (densely) on the first substrate to desired positions on the second substrate. Therefore, the area efficiency in manufacturing elements can be largely enhanced, so that it is possible to reduce the manufacturing cost.

When the elements are selectively transferred in the transfer step as described above, the semiconductor elements that are the transfer targets (transferred bodies) may be selected correspondingly to a plurality of the crystalline semiconductor films, respectively. As a result, the semiconductor elements formed within a range of the respective crystalline semiconductor films can be a unit of transfer target. Specifically, this configuration is suitable to form a unit circuit within the range. Furthermore, as the transferred body, individual elements may be selected, a plurality of elements may be selected as a unit, and the aforementioned unit circuit may be selected.

When the selective element transfer corresponding to the formation range for the crystalline semiconductor film is carried out, the semiconductor elements and the peeling layer formed on the first substrate every formation range for the crystalline semiconductor film may be divided. As a result, the transferred bodies can be separated, so that it is possible to transfer the elements. The division may be carried out along the crystal grain boundaries of the crystalline semiconductor films.

Since the portions of the crystal grain boundaries are not used to form the elements well, the mutual division of the transferred bodies can be carried out using the unused portions, so that it is possible to secure the portions of the crystalline semiconductor films in which the elements can be formed.

In the crystallization step described above, the melt and crystallization may be carried out on the condition that the semiconductor films in areas other than the fine holes are substantially in a completely melted state and the semiconductor films in the fine holes are in a partially melted state. By this condition, the melt and crystallization can be performed more excellently. The heat treatment may be carried out by using the laser irradiation. Examples of the laser may include various lasers, such as an excimer-laser, a solid-state laser, a gas laser, etc.

An aspect of the present invention also provides a semiconductor device manufactured by using the aforementioned manufacturing method. Furthermore, an aspect of the present invention provides an integrated circuit, a circuit board, an electro-optical device, and an electronic apparatus, which include the semiconductor device described above.

Here, the "integrated circuit" refers to a circuit in which semiconductor devices and relevant interconnections are integrated and wired to have a predetermined function. The "circuit board" refers to a board having a plurality of semiconductor elements on its one surface and/or the other surface and having interconnections to mutually connect the semiconductor elements as needed, and may include an active matrix substrate used for a display device, such as an organic EL display device, etc. as an example. According to an aspect of the present invention, since the minute semiconductor elements, such as TFTs, etc. can be dispersively arranged for plural pixels on the substrate with good efficiency, it is possible to manufacture a large-sized circuit board at low cost.

Here, the "electro-optical device" refers to general devices including electro-optical elements which include the semiconductor elements according to an aspect of the present invention and emit light through electrical operation or change a phase of the external light, and includes both a device to voluntarily emit light and a device to control passage of the external light. An active-matrix display device may be included, which includes, as the electro-optical elements, liquid crystal elements, electrophoresis elements having a dispersive medium in which electrophoresis particles are dispersed, electroluminescent (EL) elements, electron-emitting elements to allow electrons generated through application of electric field to come in contact with a light-emitting plate and to emit light, etc.

Here, the "electronic apparatus" refers to general apparatuses having predetermined functions, which include the semiconductor device according to an aspect of the present invention, and has, for example, the electro-optical device or a memory. The configuration of the electronic apparatus is not specifically limited, but its examples include an IC card, a portable phone, a video camera, a personal computer, a head mount display, a rear type or front type projector, a facsimile having a display function, a finder of a digital camera, a portable television, a DSP apparatus, a PDA, an electronic pocket book, an electric bulletin board, a propaganda announcement display, etc.

DETAILED DESCRIPTION OF EXEMPLARY EMBODIMENTS

Figure 1:
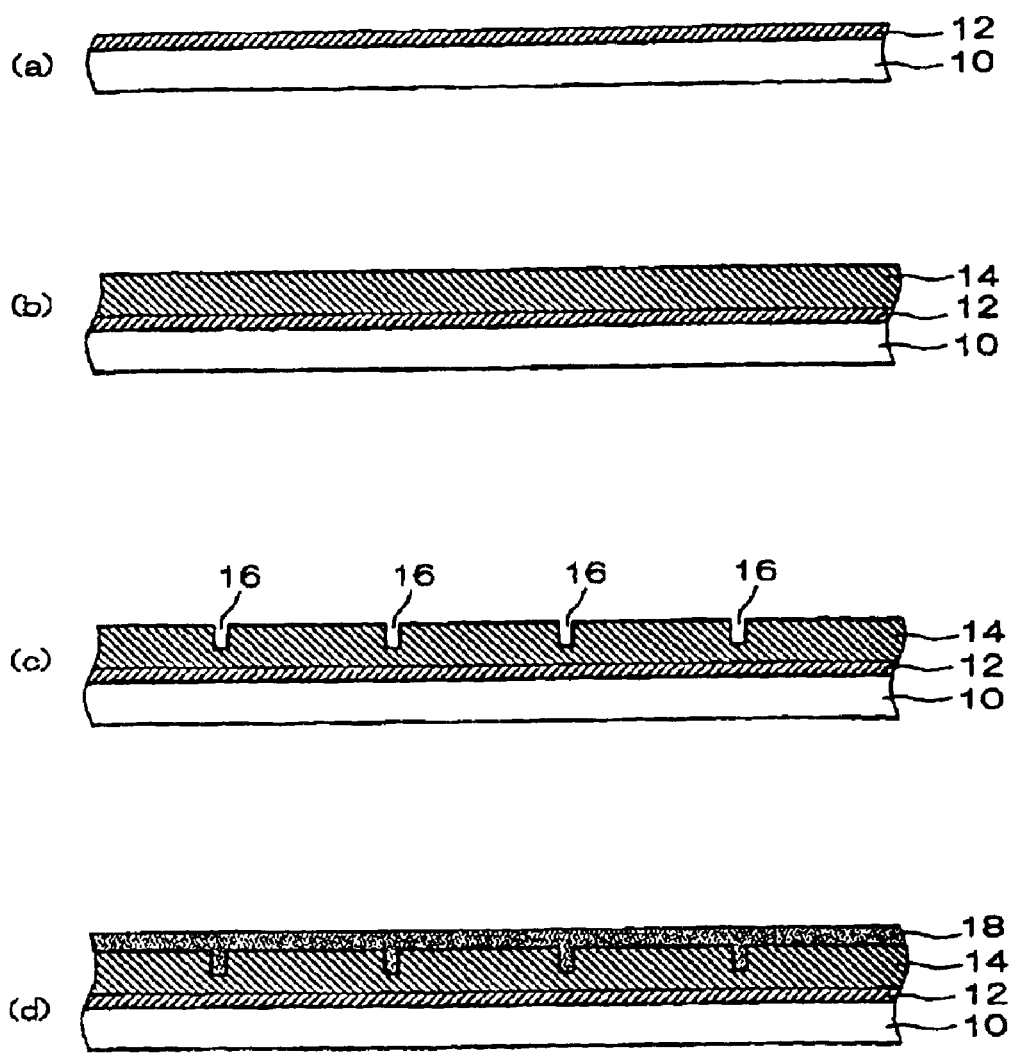
FIGS. 1(a)–1(d) are schematics illustrating a method of manufacturing a semiconductor device according to a first exemplary embodiment.
Figure 2:
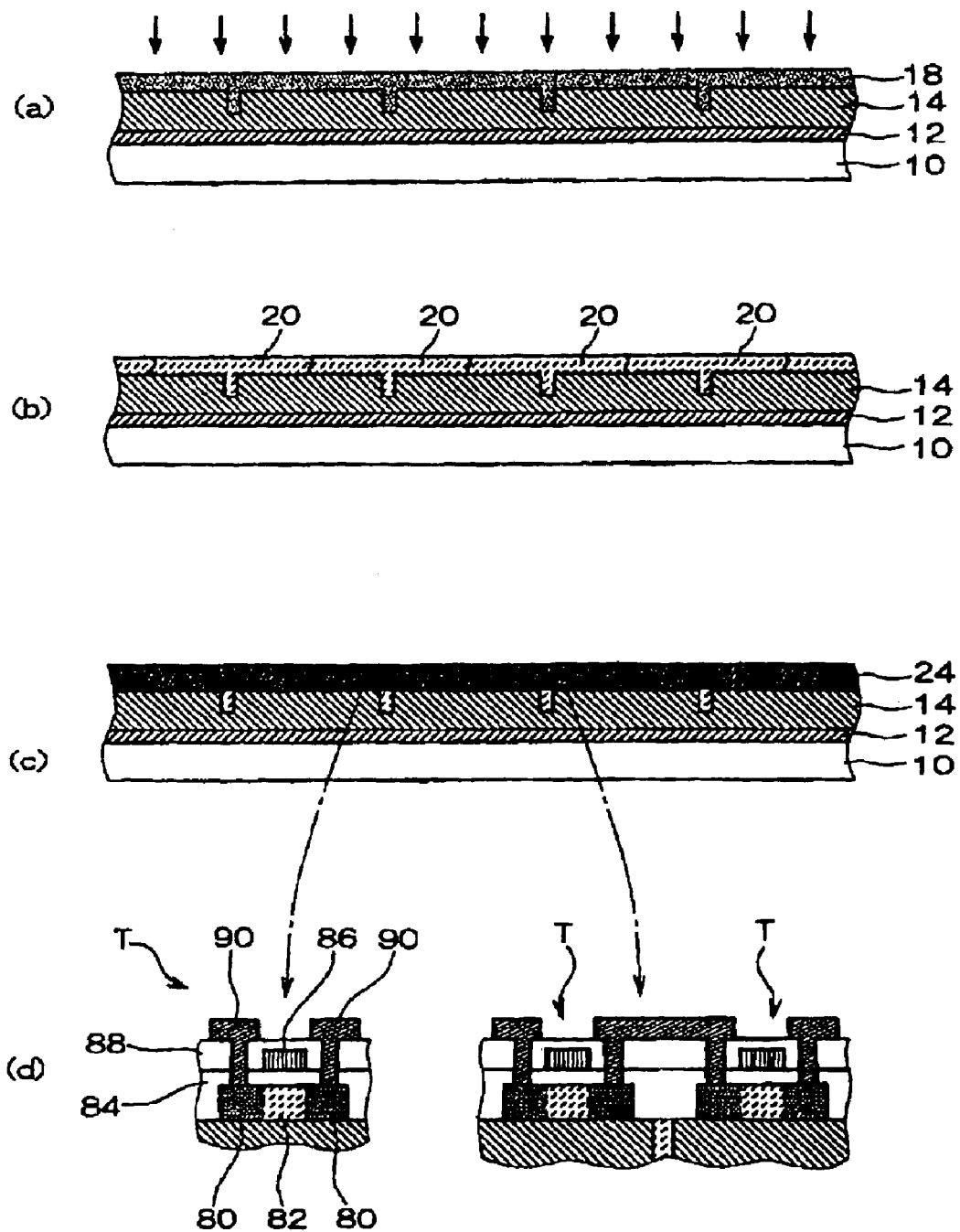
FIGS. 2(a)–2(d) are schematics illustrating a method of manufacturing a semiconductor device according to the first exemplary embodiment.
Figure 3:
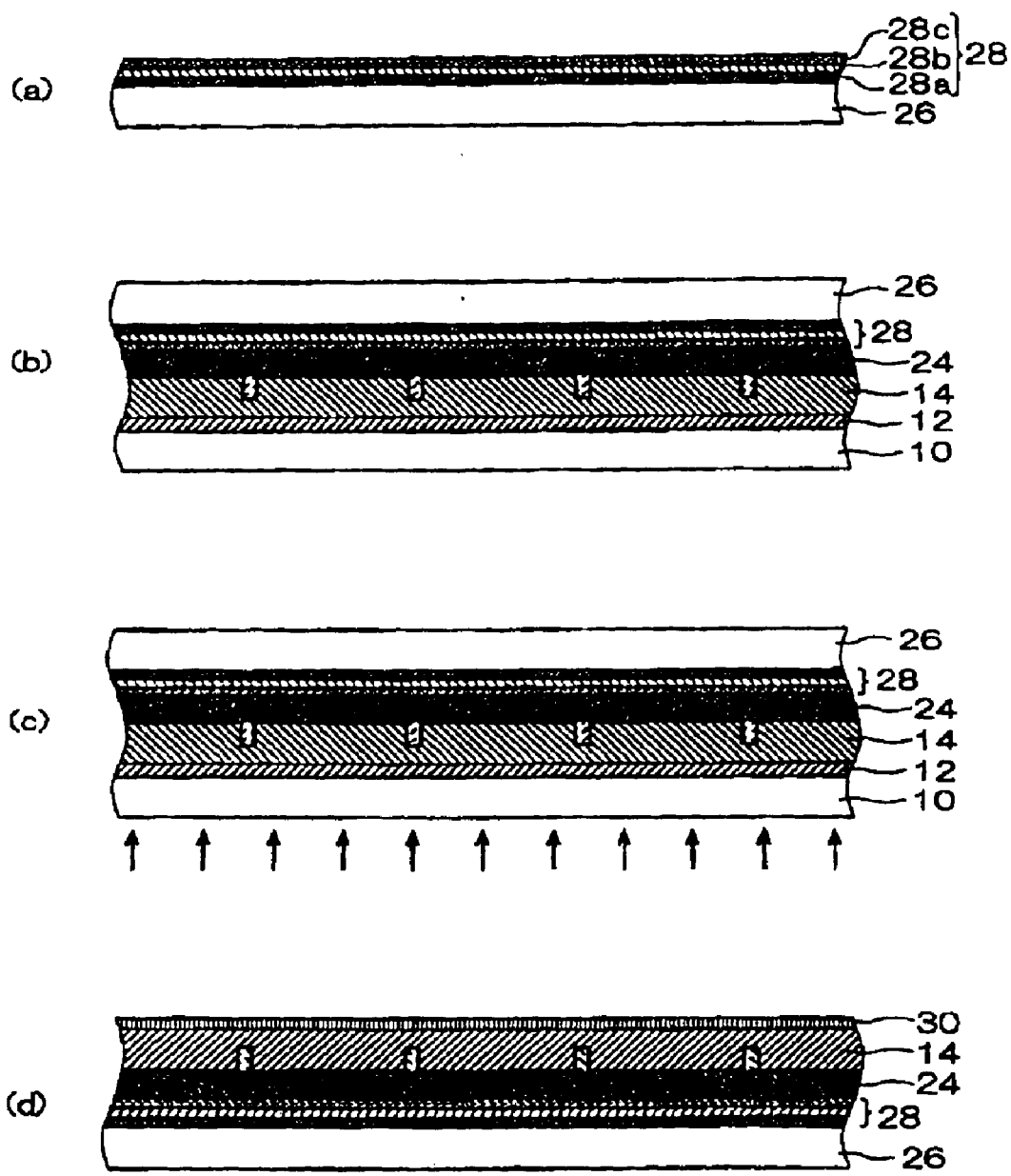
FIGS. 3(a)–3(d) are schematics illustrating a method of manufacturing a semiconductor device according to the first exemplary embodiment.

Now, exemplary embodiments of the present invention will be described with reference to the accompanying drawings.

First Exemplary Embodiment

FIGS. 1 to 4 are schematics illustrating a method of manufacturing a semiconductor device according to a first exemplary embodiment.

Forming of Peeling Layer

As shown in FIG. 1(a), a peeling layer (light absorbing layer) 12 is formed on a first substrate 10 which should be an original transfer substrate.

The first substrate 10 may have a size, shape and thermal resistance applicable to a semiconductor process which can process at least a semiconductor wafer, and is made of material with high reliability. This is because, for example, when forming elements, etc. to be a transferred body, the process temperature may be increased (for example, about 350° C. to 1000° C.) depending upon the kinds or the forming methods. But in this case, a range in which the film forming condition, such as the temperature condition can be set is widened in forming the elements on the first substrate 10 if the first substrate 10 has an excellent thermal resistance. By using the first substrate 10 having the thermal resistance, a high-temperature process can be carried out, and elements or circuits with high reliability and high performance can be manufactured on the first substrate 10.

Specifically, the first substrate 10 may be made of a material of which a distortion point is Tmax or more, where Tmax indicates the maximum temperature in forming the elements. That is, the distortion point of the material constituting the first substrate 10 may be 350° C. or more, and may be 500° C. or more. Examples of such material can include thermal resistant glass, such as quartz glass, Corning 7059, Nippon Electric Glass OA-2, etc. The thickness of the first substrate 10 is not specifically limited, but may be 0.1 mm though 5.0 mm and may be 0.5 mm to 1.5 mm. The surface roughness of the first substrate may be 10 $\mu$m to 30 $\mu$m.

The size and shape of the first substrate 10 may be substantially the same as a general semiconductor wafer (silicon wafer, etc.). The semiconductor process may be an LSI manufacturing process. By employing these conditions, the fine patterning similar to using the semiconductor wafer can be performed in forming the element to be described later, thereby forming the elements.

The first substrate 10 may have a light transmission property that light can pass. As a result, the light can be applied to the peeling layer 12 through the first substrate 10. By the application of light, the peeling at the inside and/or the boundary of the peeling layer 12 can be generated rapidly and accurately. In this case, the transmissivity of light of the first substrate 10 may be 10% or more, and may be 50% or more. This is because the loss of light is decreased with increase of the transmissivity, so that less amount of light is required for peeling the peeling layer 12.

In this way, the first substrate 10 has various conditions. But since the first substrate 10 can be repeatedly used unlike a substrate to be a final product, increase of the manufacturing cost can be suppressed by repeatedly using the first substrate even if expensive material is used for the first substrate.

When external energy is applied to the peeling layer 12 by using a light irradiation method, etc., the peeling layer 12 has a feature that the peeling (hereinafter, "inside peeling", "boundary peeling") is generated at the inside and/or the boundary thereof. By light irradiation, the bonding force between atoms or between molecules of the material constituting the peeling layer 12 is lost or reduced. Specifically, ablation occurs to cause the inside peeling and/or the boundary peeling. Gas may be emitted from the peeling layer 12 by the light irradiation, so that the separation effect may appear. Components contained in the peeling layer 12 may be gasified and emitted, or the peeling layer 12 absorbs the light so that the peeling layer is gasified temporarily and the vapor thereof may be emitted, thereby contributing to the separation. The peeling layer 12 may be made of various materials, such as (A) amorphous silicon, (B) various oxide ceramics or ferroelectrics, (C) ceramics or dielectrics (ferroelectrics), (D) nitride ceramics, (E) organic polymer material, (F) metal, etc. The method of forming the peeling layer 12 is not specifically limited, and can be selected depending upon various conditions, such as a film composition or a film thickness.

In this exemplary embodiment, amorphous silicon is used for the peeling layer 12. The amorphous silicon may contain hydrogen (H). In this case, the H content is may be 2 atomic percent or more, and maybe 2 to 20 atomic percent. The peeling layer may be formed as a multilayer film. The multilayer film may include, for example, an amorphous silicon film and a metal film formed thereon. The multilayer film may be made of at least one of ceramics, metal, and organic polymer material described above.

Forming the Insulating Film

Next, as shown in FIG. 1(b), the insulating film 14 is formed on the peeling layer 12. In this exemplary embodiment, a silicon oxide film is used as the insulating film 14. But others (for example, a silicon nitride film, etc.) may be used. A method of forming the silicon oxide film may include a plasma-enhanced chemical vapor deposition (PECVD) method or a low-pressure chemical vapor deposition (LPCVD) method, or a physical vapor deposition method, such as a sputtering method. The silicon oxide film with a thickness of 100 nm is formed, for example, by using the PECVD method).

Forming the Fine Hole

Next, as shown in FIG. 1(c), a plurality of fine holes 16 are formed in the insulating film 14. For example, the fine holes 16 are formed at predetermined positions in a surface of the insulating film 14, by carrying out a photolithography process and an etching process. The etching method may employ, for example, a reactive ion etching process using plasma of $CHF_3$ gas. The diameter of the fine holes 16 may be about 50 nm to 200 nm. The fine holes 16 may be formed in a cylindrical shape, but may be formed in a shape (for example, a conical shape, a prismatic shape, a pyramidal shape, etc.) other than the cylindrical shape. The fine holes 16 may be formed by forming holes with a relatively large diameter (for example, about 500 nm) and then depositing a new insulating film (silicon oxide film in this exemplary embodiment) on the whole surface of the substrate to narrow the diameter of the holes.

Forming the Film

Next, as shown in FIG. 1(d), a semiconductor film 18 is formed on the insulating film 14 and in the fine holes 16. In this exemplary embodiment, an amorphous or polycrystalline silicon film is formed as the semiconductor film. The silicon film may be formed in a thickness of about 30 nm to 100 nm by using a film forming method, such as the LPCVD method, etc.

Melt and Crystallization Step

Next, as shown in FIG. 2(a), the semiconductor film 18 is melted and crystallized by heat treatment. The heat treatment may be carried out by laser irradiation. For example, in a case where the amorphous or polycrystalline silicon film is formed as the semiconductor film 18, the laser irradiation may be carried out with an energy density of 0.4 $J/cm^2$ to 1.5 $J/cm^2$ by using XeCl pulse excimer laser (with a wavelength of 308 nm and a pulse width of 30 nsec). In this case, the applied XeCl pulse excimer laser is most absorbed in the vicinity of a surface of the amorphous (or polycrystalline) silicon film. This is because absorption coefficients of amorphous silicon and polycrystalline silicon at the wavelength (308 nm) of the XeCl pulse excimer laser are large to the extent of 0.139 $nm^{-1}$ and 0.149 $nm^{-1}$, respectively. Since the silicon oxide film as the insulating film 14 is substantially transparent for the laser and does not absorb the energy of laser, it is not melted by the laser irradiation. As a result, the amorphous silicon film positioned in an area other than the fine holes 16 is in a substantially completely melted state all over the thickness direction. The amorphous silicon film in the fine holes 16 is in a state (a partially melted state) where the amorphous silicon film is melted in the vicinity of surfaces thereof but is not melted in the vicinity of bottoms of the fine holes 16.

Solidification of silicon after the laser irradiation, is first started from inside of the fine holes 16, and then reaches portions (portions on the surface side) of the amorphous silicon film which are in the substantially completely melted state. At this time, several crystal grains are generated in the vicinity of the bottoms of the fine holes 16. But by setting a sectional size of the fine holes 16 to be equal to or slightly smaller than that of one crystal grain, only one crystal grain reaches tops (openings) of the fine holes 16. As a result, in the portions of the amorphous silicon film which are substantially in the completely melted state, crystal growth is advanced using one crystal grain having reached the tops of the fine holes 16 as a seed. As shown in FIG. 2(b), a plurality of crystalline semiconductor films 20 including substantially single-crystalline grains are formed in areas (for example, several μm square areas) substantially centered on the plurality of fine holes 16, respectively.

Figure 5:
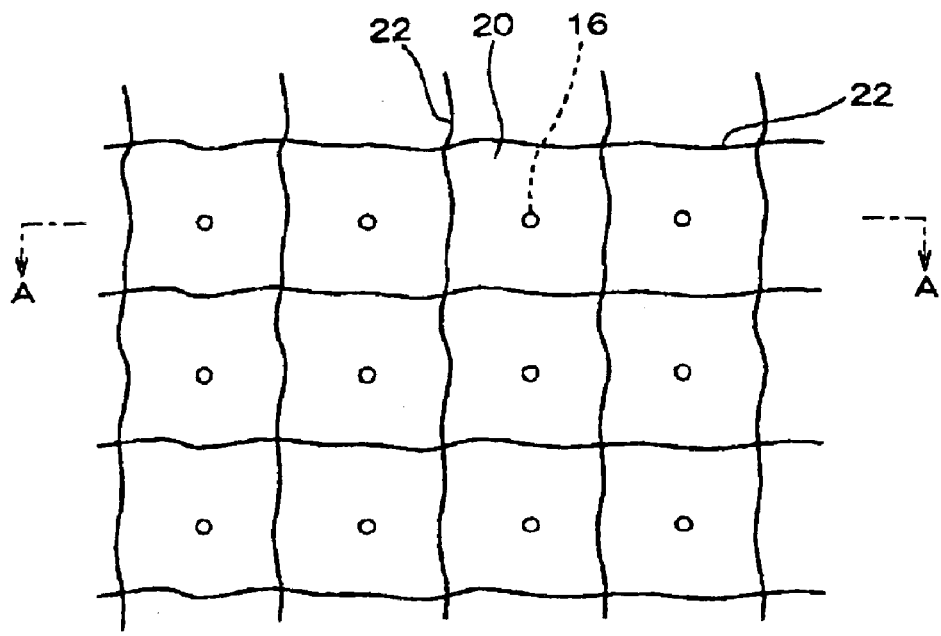
FIG. 5 is a schematic of a crystalline semiconductor film as seen from a surface side.

FIG. 5 is a schematic of the crystalline semiconductor films 20 as seen from the top side. A section taken along a plane A—A of the figure corresponds to FIG. 2(b). As shown in FIG. 5, the respective crystalline semiconductor films 20 are formed in a block shape, and are arranged with crystal grain boundaries 22 interposed. These crystalline semiconductor films 20 have advantages that the number of defects are small and a trap state density in the vicinity of a center of a forbidden band of an energy band is decreased from the viewpoint of electrical characteristics of a semiconductor film. Furthermore, since it can be considered that the crystal grain boundaries in the crystalline semiconductor films 20 do not almost exist, barriers when carriers, such as electrons or holes travel can be largely reduced. By forming semiconductor elements by using the crystalline semiconductor films 20, it is possible to obtain elements excellent in characteristics.

Forming the Element

Next, as shown in FIG. 2(c), a transfer origin layer 24 including semiconductor elements, such as transistors, diodes, resistors, etc. are formed using the crystalline semiconductor films 20. Each of the crystalline semiconductor films 20 is formed in a block shape of which one side is several μm as described above, but in this exemplary embodiment as described above, since the fine patterning can be performed by setting various conditions to allow the LSI manufacturing process to be applied, many semiconductor elements can be manufactured using one crystalline semiconductor film 20. In this exemplary embodiment, a plurality of semiconductor elements is formed within a range of one crystalline semiconductor film 20. By properly combining the plurality of semiconductor elements formed using one crystalline semiconductor film 20, a unit circuit having a predetermined function is constructed. In this case, the respective semiconductor elements are formed within a range of the respective crystalline semiconductor film 20 not to include the crystal grain boundaries 22 between the crystalline semiconductor films 20. In a case where a unit circuit is formed by combining the plurality of semiconductor elements, the respective semiconductor elements are formed such that the unit circuit is received within a range of one crystalline semiconductor film 20.

FIG. 2(d) shows an example of the semiconductor elements formed. In this exemplary embodiment, for example, a unit circuit, such as a thin film transistor T or a CMOS circuit constructed by combining a plurality of thin film transistors T is formed. Each thin film transistor T includes source and drain regions 80, a channel forming region 82, a gate insulating film 84, a gate electrode 86, an interlayer insulating film 88, and source and drain electrodes 90, which are formed using the crystalline semiconductor film 20. The thin film transistor T can be manufactured using well-known manufacturing methods.

First Bonding

Next, as shown in FIG. 3(a), a multilayer film 28 obtained by stacking a protective layer 28a, a light absorbing layer 28b and an adhesive layer 28c is formed on a temporary transfer substrate 26. Next, as shown in FIG. 3(b), the first substrate 10 is superposed on the adhesive layer 28c of the temporary transfer substrate 26. The transfer origin layer 24 formed on the first substrate 10 is bonded to the temporary transfer substrate 26 through the adhesive layer 28c.

Here, the temporary transfer substrate 26 is not specifically limited, but may be a light transmitting substrate.

Further, the temporary transfer substrate 26 may be a flat plate or a curved plate. Furthermore, the temporary transfer substrate may be poorer at characteristics, such as thermal resistance, corrosion resistance, etc. than the first substrate 10. This is because in this exemplary embodiment, characteristics (specifically, thermal resistance) required for the temporary transfer substrate 26 do not relate to the process conditions (specifically, process temperature) required to form the semiconductor elements, since the semiconductor elements are formed on the first substrate 10 side and then the semiconductor elements are transferred to the temporary transfer substrate 26.

Therefore, if the maximum temperature in forming the semiconductor elements is Tmax, a material, of which a glass transition point Tg or a softening point is Tmax or less, can be used as a constituent material of the temporary transfer substrate 26. For example, the temporary transfer substrate 26 may be formed out of a material of which the glass transition point or the softening point may be 800° C. or less, more preferably 500° C. or less, and 320° C. or less.

The temporary transfer substrate 26 may have some extent of rigidity (strength) as a mechanical feature, but may have flexibility or elasticity. The temporary transfer substrate 26 may be made of various synthetic resins or various glass materials. Specifically, various synthetic resins or usual (low melting) inexpensive glass materials may be used. The synthetic resins may be thermoplastic resins or thermosetting resins, and examples thereof may include various resins, such as polyethylene or polypropylene, etc. Furthermore, examples of the glass materials may include various glass materials, such as quartz glass (silicate glass), silicate alkali glass, soda-lime glass, etc. Since the glass materials other than silicate glass have lower melting points, are more easily shaped and processed, and are cheaper than the silicate glass, they are specifically suitable as a material to form the temporary transfer substrate 26.

The protective film 28a constituting the aforementioned multilayer film 28 serves as protecting the temporary transfer substrate 26 from heat generated in the light absorbing layer 28b in applying light to the multilayer film 28, and may be made of, for example, an inorganic film such as silicon oxide, silicon nitride, etc., or a synthetic resin material. Further, the light absorbing layer 28b may be selected from materials capable of converting the applied light into heat, and may be made of, for example, silicon, metal, carbon black, light-polymerized monomer or oligomer. Furthermore, the adhesive layer 28c may be made of various cure adhesives, such as a reactive curable adhesive, a thermosetting adhesive, a photo-curable adhesive, such as an ultraviolet curable adhesive, or an anaerobic curable adhesive, etc. The above adhesives may have any composition of epoxy, acrylate, silicon, etc.

First Peeling

Next, as shown in FIG. 3(c), the energy application through the light irradiation to the whole surface of the peeling layer 12 from a back side of the first substrate 10 is carried out to a bonded body of the first substrate 10 and the temporary transfer substrate 26, thereby causing the peeling at the inside and/or the boundary of the peeling layer 12. By causing the peeling in the peeling layer 12, the insulating film 14 and the transfer origin layer 24 are separated from the peeling layer 12 and bonded only to the temporary transfer substrate 26.

A principle that the inside peeling and/or the boundary peeling is generated in the peeling layer 12 includes occurrence of ablation in the material constituting the peeling layer 12, emission of gas contained in the peeling layer 12, and phase change, such as melting, evaporation, etc. occurring right after the light irradiation. Here, the "ablation" refers to the fixing material (the material constituting the peeling layer 12) absorbing the applied light, is excited photo-chemically or thermally and bonds between atoms or between molecules of the surface of the inside thereof are broken, thereby emitting the atoms or the molecules, and appears as a phenomenon that all or a part of the constituent material of the peeling layer 12 makes the phase change, such as melting, evaporation (vaporization), etc. By the phase change, the peeling layer may turn to a minutely foamed state, thereby decreasing the bonding force. Whether the peeling layer 12 makes the inside peeling, the boundary peeling, or both thereof depends upon the composition of the peeling layer 12 or various other factors. But the factors may include conditions, such as a kind, a wavelength, an intensity, an approaching depth, etc. of the applied light.

Examples of the applied light may include X-ray, ultraviolet ray, visible ray, infrared ray (heat ray), laser beam, millimeter wave, microwave, electron ray, radiation ray ($\alpha$-ray, $\beta$-ray, $\gamma$-ray), etc. The laser beam may be used as the applied light, specifically in that the peeling (ablation) of the peeling layer 12 can be easily caused and highly accurate irradiation is possible. As the laser apparatus to generate the laser beam, various gas lasers, solid-state lasers (semiconductor lasers), etc. can be included. But an excimer laser, an Nd-YAG laser, an Ar laser, a $CO_2$ laser, a He—Ne laser, etc. be used.

The laser beam may have a short wavelength of about 100 nm to 350 nm. Specifically, since the excimer laser outputs high energy with short wavelength, and thus can cause the ablation in the peeling layer 12 for a very short time, the excimer laser may be used. Alternatively, in a case where the separation property is given to the peeling layer 12 through a phase change, such as gas emission, vaporization, sublimation, etc., the wavelength of the laser beam may be about 350 nm to 1200 nm. The laser beam having such wavelength can be used through a laser source or an irradiation equipment used widely in a general processing field, such as a YAG laser or a gas laser. Thus the light irradiation can be simply carried out at low cost. By using the laser beam having a wavelength within a range of visible ray, any material can be used for the first substrate only if the first substrate 10 can transmit the visible ray, so that it is possible to enhance the degree of freedom in selection of the first substrate 10.

The energy density of the laser beam to be applied may be about 10 $mJ/cm^2$ to 5000 $mJ/cm^2$, for example, in a case of using the excimer laser, and about 10 $mJ/cm^2$ to 500 $mJ/cm^2$. The irradiation time may be about 1 nsec to 1000 nsec, and 10 nsec to 100 nsec. If the energy density is low or the irradiation time is short, sufficient ablation will not occur. If the energy density is high or the irradiation time is long, the applied light passing through the peeling layer 12 may adversely influence the semiconductor elements included in the transfer origin layer 24.

First Separation

Next, as shown in FIG. 3(d), the first substrate 10 is separated from the temporary transfer substrate 26. Then a thermal fusion-bonding sheet 30 including a thermal fusion-bonding adhesive is bonded to the insulating film 14.

At this time, since peeling residuals of the peeling layer 12 may be attached to the insulating film 14 and/or the transfer origin layer 24 transferred to the temporary transfer substrate 26 side, they may be completely removed. A method of removing the remaining peeling layer 12 may be properly selected from, for example, methods, such as cleaning, etching, ashing, polishing, etc., or methods as combinations of these methods. Even when the peeling residuals of the peeling layer 12 are attached to a surface of the first substrate 10 from which the transfer origin layer 24 has been transferred, the peeling residuals can be removed using the aforementioned methods. As a result, the first substrate 10 can be used for recycle. In this way, by recycling the first substrate 10, waste of the manufacturing cost can be reduced or prevented. This advantage is specifically effective in a case where the first substrate 10 is made of expensive material, such as quartz glass, or rare material.

As the thermal fusion-bonding sheet 30 described above, one kind or a mixture of two or more kinds among thermal fusion-bonding resins, such as polyolefin resin (polyethylene, polypropylene, EVA, etc.), epoxy resin, fluorinated resin, acrylic resin containing carboxyl group, etc. can be used. The thickness of the thermal fusion-bonding sheet 30 may be about 0.1 µm to 100 µm, and about 1 µm to 50 µm. The method of providing the thermal fusion-bonding sheet 30 onto the insulating film 14 is not specifically limited, and may employ, for example, a method of mounting the thermal fusion-bonding sheet cut correspondingly to the temporary transfer substrate on the insulating film 14 and heating and pressing them. Furthermore, in place of providing the thermal fusion-bonding sheet 30 on the insulating film 14 at this point of time, the sheet may be inserted at the point of time when the second substrate (final substrate) to be described later is mounted on the transfer origin layer 24.

Second Bonding

Figure 4:
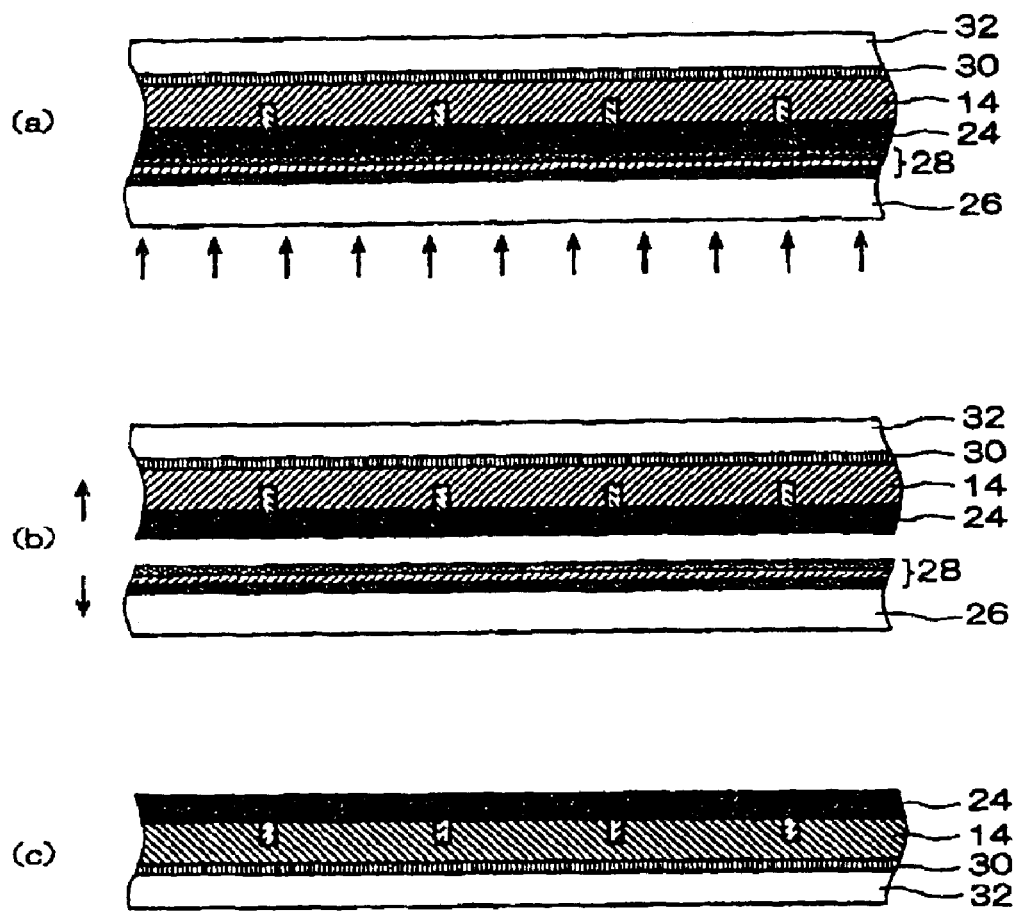
FIGS. 4(a)–4(c) are schematics illustrating a method of manufacturing a semiconductor device according to the first exemplary embodiment.

Next, as shown in FIG. 4(*a*), the second substrate (transfer destination substrate) 32 to which the transfer origin layer 24 including the semiconductor elements is transferred is mounted on the thermal fusion-bonding sheet 30 of the temporary transfer substrate 26. Light irradiation is performed from the temporary transfer substrate 26 side, so that the insulating film 14 and the transfer origin layer 24 are bonded to the second substrate 32.

Here, the light used is sufficient only if the light absorbing layer 28*c* of the multilayer film 28 emits heat by the light irradiation and the thermal fusion-bonding sheet 30 can cause the fusion-bonding by the emitted heat. Examples of the light may include X-ray, ultraviolet ray, visible ray, infrared ray (heat ray), laser beam, millimeter wave, microwave, electron ray, radiation ray (α-ray, β-ray, γ-ray), etc. Specifically, the laser beam is preferable. As the laser beam, laser beam of the same kind as described in the first peeling step may be used, and laser beam of another kind may be used. By applying such laser beam, the heat generated from the light absorbing layer 28*c* to which the light has been applied is transmitted to the thermal fusion-bonding sheet 30. Thus the insulating film 14 supporting the transfer origin layer 24 is bonded to the second substrate 32 through the thermal fusion-bonding adhesive layer (the thermal fusion-bonding sheet 30 which was melted once and solidified).

The aforementioned second substrate 32 may have some extent of rigidity (strength), but may have flexibility or elasticity. Examples of the constituent material of the second substrate may include various synthetic resins or various glass materials, and specifically usual (low melting-point) inexpensive glass materials may be used. The synthetic resins may be thermoplastic resins or thermosetting resins. Examples thereof may include various resins, such as polyethylene or polypropylene, etc. Furthermore, examples of the glass materials may include various glass materials, such as quartz glass (silicate glass), silicate alkali glass, soda-lime glass, etc. Since the glass materials other than silicate glass have lower melting points, are more easily shaped and processed, and are cheaper than the silicate glass, they are specifically suitable.

When the second substrate 32 is made of a synthetic resin, there are advantages that it is easy to integrally shape a large-sized substrate or to shape a substrate having complex shapes, such as curved surface or unevenness, and both material cost and manufacturing cost are low. Therefore, use of the synthetic resins is advantageous to manufacture a large-sized and inexpensive device (for example, liquid crystal display devices or EL display devices).

The second substrate 32 may constitute an independent device such as, for example, a liquid crystal cell, or constitute a part of a device such as, for example, a color filter, an electrode layer, a dielectric layer, an insulating layer, a semiconductor element, etc. The second substrate 32 may be made of metal, ceramics, stone, wood, paper, etc., and may be any top surface constituting any product (for example, a top surface of a watch, a top surface of air-conditioner, a top of a printed circuit board), or a surface of a structure, such as a wall, a pillar, a ceiling, a glass window, etc.

Second Separation

Next, as shown in FIG. 4(*b*), the temporary transfer substrate 26 is separated from the second substrate 32, by applying external force to the temporary transfer substrate 26 and the second substrate 32 in a direction in which both of the temporary transfer substrate and the second substrate are spaced apart from each other. As a result, as shown in FIG. 4(*c*), the transfer origin layer 24 including the plurality of semiconductor elements and the insulating film 14 supporting the transfer origin layer are transferred to the second substrate 32.

In this way, in this exemplary embodiment, since a substrate having conditions (shape, size, physical characteristics, etc.) suitable to form the crystalline semiconductor film or forming elements thereafter can be used as the first substrate, it is possible to form fine and high-performance semiconductor elements on the first substrate. The second substrate can be formed to have a large area without restriction of element forming processes, and a desired substrate can be selected and used from wide options, such as inexpensive substrates made of synthetic resin or soda glass, or flexible plastic films. Therefore, it is possible to form the fine and high-performance thin film semiconductor elements on a large-sized substrate with ease (at low cost).

Furthermore, in this exemplary embodiment, since twice element transfers are carried out through the temporary transfer substrate and the upper and lower structural relationship of the semiconductor elements formed on the first substrate reappears on the second substrate, related art techniques, such as designs of element structure or manufacturing processes can be used almost without change, and thus it is convenient.

Figure 6:
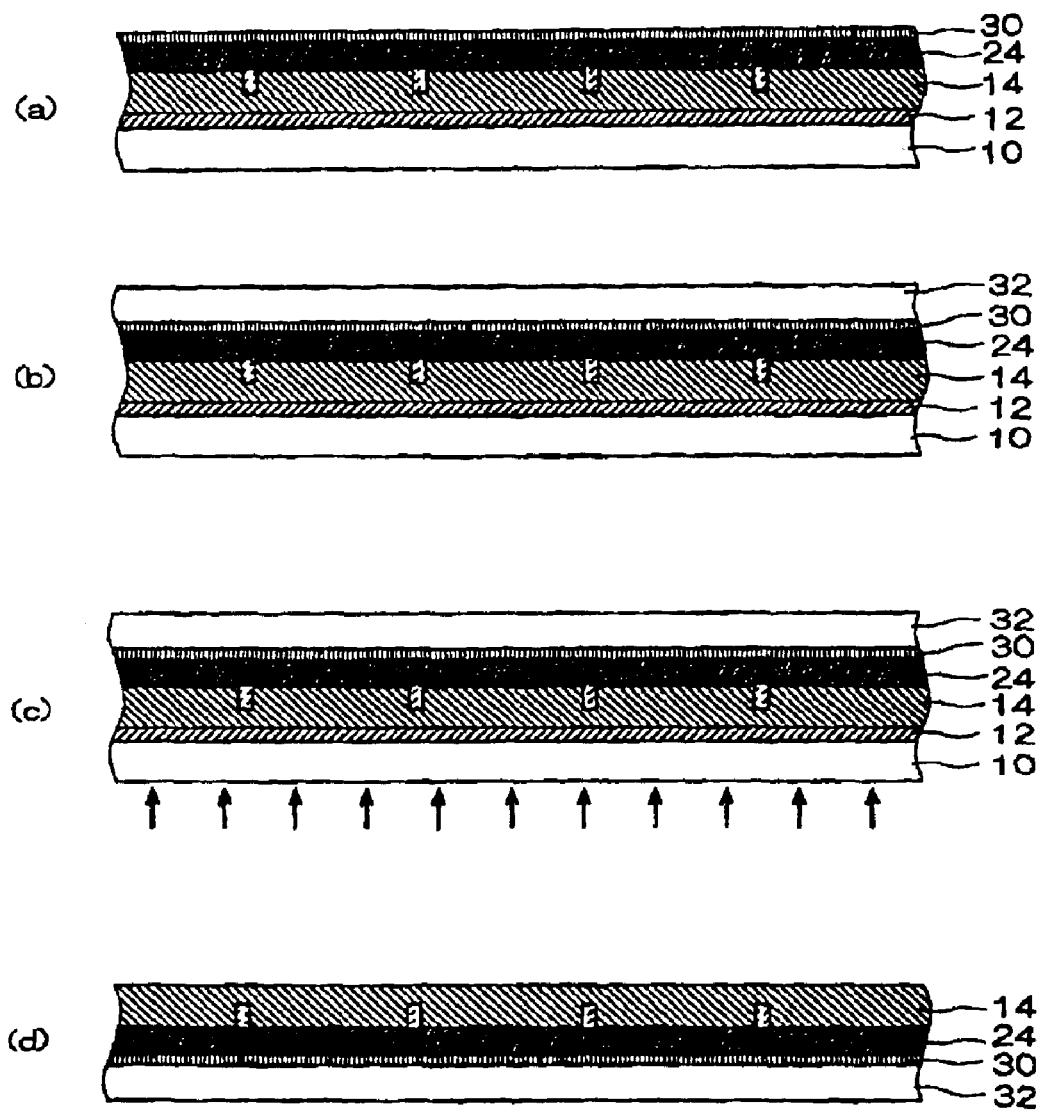
FIGS. 6(a)–6(d) are schematics illustrating a method of manufacturing a semiconductor device according to a modified example of the first exemplary embodiment.

The transfer of the semiconductor elements (the transfer origin layer) may be performed directly from the first substrate 10 to the second substrate 32 without using the temporary transfer substrate 26. FIG. 6 is a schematic illustrating a manufacturing method in this case. After the transfer origin layer 24 including the semiconductor elements is formed similarly to the aforementioned forming the element, as shown in FIG. 6(*a*), the thermal fusion-bonding sheet 30 is attached to a top side of the transfer origin layer 24. Next, as shown in FIG. 6(*b*), the second substrate 32 to which the transfer origin layer 24 should be transferred is mounted on the thermal fusion-bonding sheet 30. Then the light irradiation is carried out thereto from the second substrate 32 side, so that the transfer origin layer 24 is bonded to the second substrate 32. Next, as shown in FIG. 6(*c*), by applying energy to the bonded body of the first substrate 10 and the second substrate 32 by the light irradiation to the whole surface of the peeling layer 12 from a back side of the first substrate 10, the peeling is caused at the inside and/or the boundary of the peeling layer 12. By causing the peeling in the peeling layer 12, the transfer origin layer 24 is separated from the peeling layer 12, and transferred to the second substrate 32. In this manufacturing method, the upper and lower structural relationship of the semiconductor elements included in the transfer origin layer 24 is inverted each other between the first substrate 10 and the second substrate 32, but there is an advantage that the processes can be simplified.

Second Exemplary Embodiment

In the first exemplary embodiment described above, the transfer origin layer including the plurality of semiconductor elements or unit circuits constructed by combining the semiconductor elements has been integrally transferred to the second substrate. But the individual semiconductor elements or unit circuits included in the transfer origin layer may be partially (selectively) transferred. Now, a manufacturing method in this case will be described.

Figure 7:
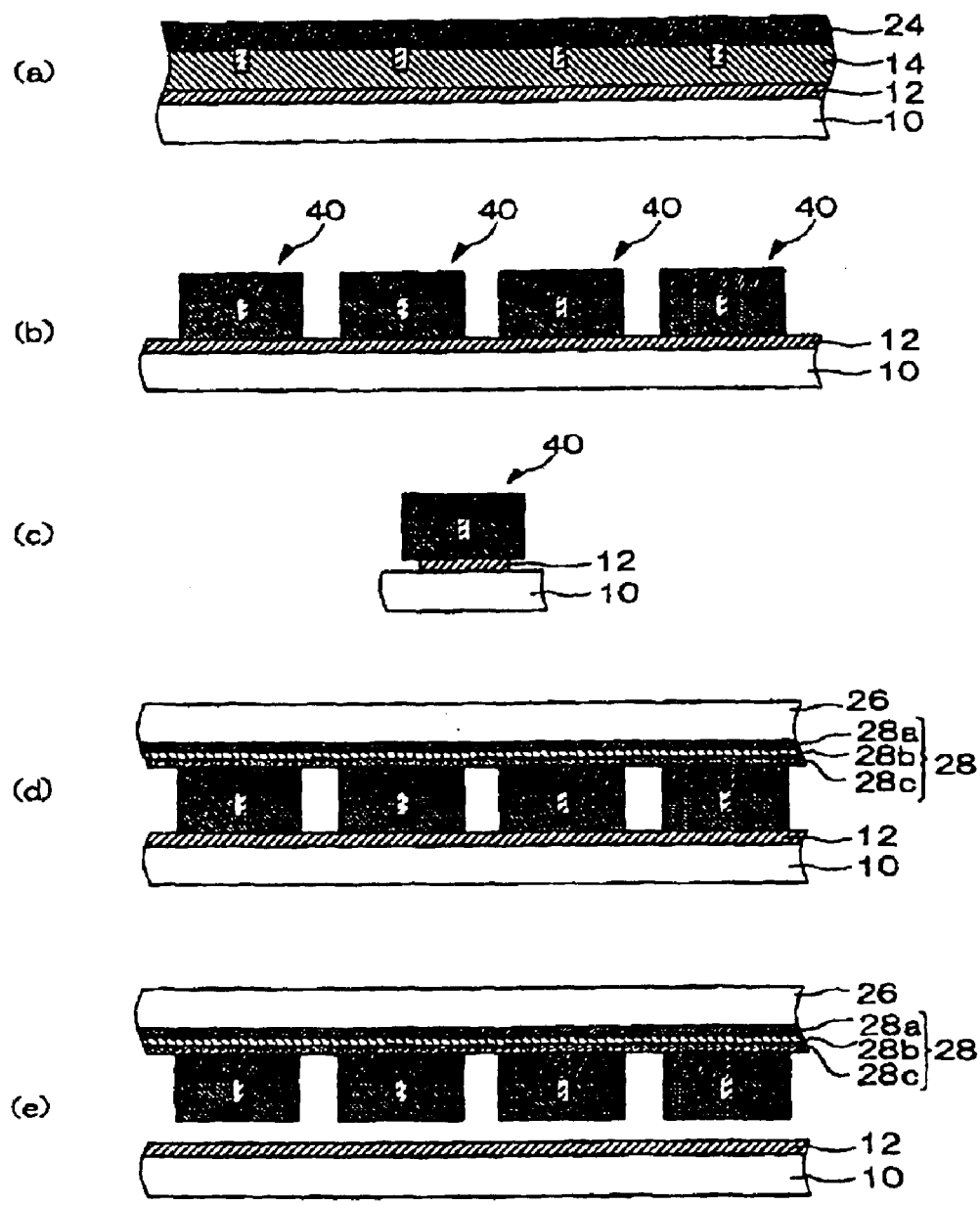
FIGS. 7(a)–7(c) are schematics illustrating a method of manufacturing a semiconductor device according to a second exemplary embodiment.
Figure 8:
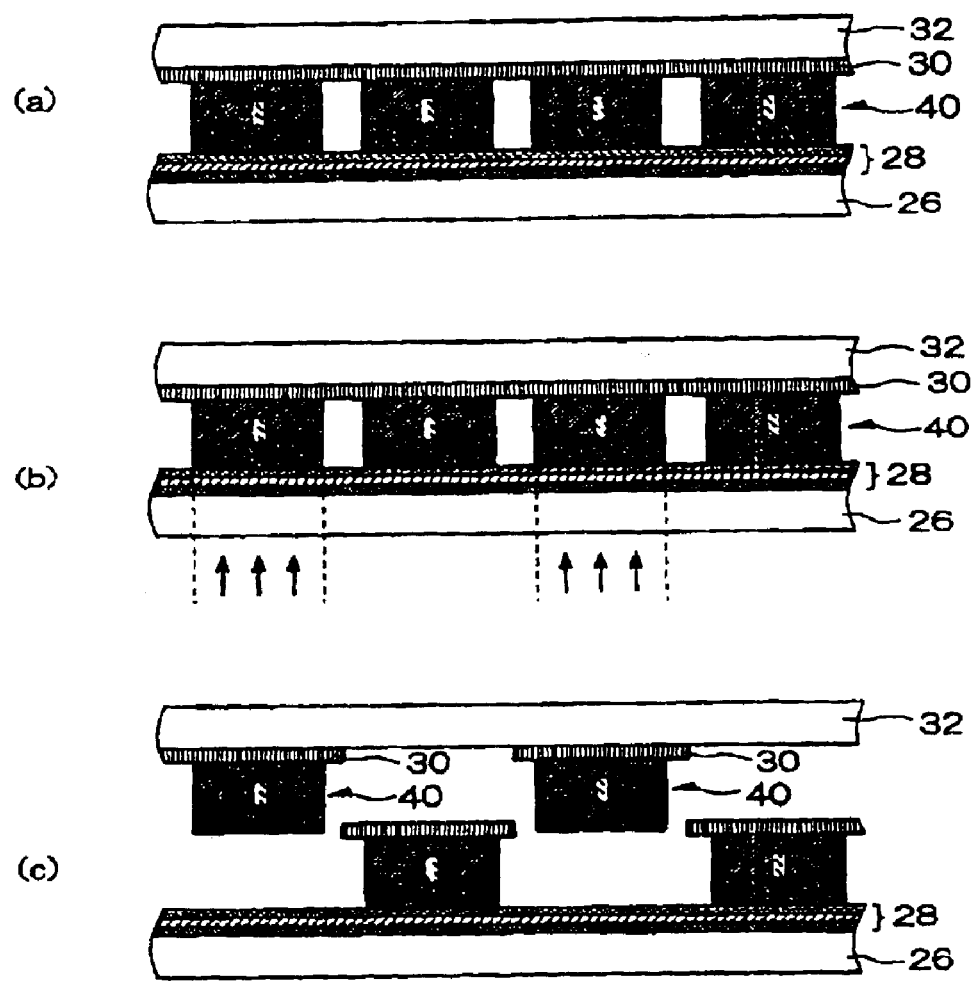
FIGS. 8(a)–8(c) are schematics illustrating a method of manufacturing a semiconductor device according to the second exemplary embodiment.

FIGS. 7 and 8 are schematics illustrating a method of manufacturing a semiconductor device according to the second exemplary embodiment. First, similarly to the first exemplary embodiment described above, forming the peeling layer, forming the insulating film, forming the fine hole, forming the film, the melt and crystallization, forming the element are performed, respectively, so that the transfer origin layer 24 is obtained on the first substrate 10, as shown in FIG. 7(*a*).

Division

Next, as shown in FIG. 7(*b*), the transfer origin layer 24 and the insulating film 14 formed on the first substrate 10 are divided. At that time, the transfer origin layer 24 is divided into various shapes including every individual semiconductor element, every area including a desired number of semiconductor elements, every unit circuit, every functional area including a plurality of unit circuits, etc., depending upon situations when the selective element transfer is performed later. For example, the division may be performed for every crystalline semiconductor film 20. In this case, an etching process is performed along the aforementioned crystal grain boundaries 22 (see FIG. 5). This is because the crystal grain boundaries 22 and the peripheries thereof are poor in characteristics as a semiconductor film. Thus the semiconductor films in the aforementioned areas are not used to form the semiconductor elements in this exemplary embodiment. The bonded bodies of the transfer origin layers 24 and the insulating films 14 after division every desired unit are hereinafter referred to as "transfer origin bodies 40".

In the division, an etching process may be performed such that the peeling layers 12 directly under the respective transfer origin bodies 40 remain in an island shape. In addition, when performing the etching process, as shown in FIG. 7(*c*), the peeling layers may be over-etched such that the bonding areas between the peeling layers 12 and the transfer origin bodies 40 are smaller than the total area of the transfer origin bodies 40. As a result, the peeling can be caused in the peeling layer 12, and the energy required for the light irradiation to the peeling layer 12 can be reduced.

First Bonding

Next, as shown in FIG. 7(*d*), the first substrate 10 is superposed on the temporary transfer substrate 26 on which the multilayer film 28 is obtained by stacking the protective layer 28. The light absorbing layer 28*b* and the adhesive layer 28*c* are formed. All the transfer origin bodies 40 formed on the first substrate 10 are bonded to the temporary transfer substrate 26 through the adhesive layer 28*c*. The suitable manufacturing conditions for the above are similar to those of the first exemplary embodiment described above, and thus description thereof will be omitted.

First Peeling Step

Next, the energy application through the light irradiation to the whole surface of the peeling layers 12 from a back side of the first substrate 10 is carried out to the bonded body of the first substrate 10 and the temporary transfer substrate 26, thereby causing the peeling at the inside and/or the boundary of the peeling layers 12. By causing the peeling in the peeling layers 12, the transfer origin bodies 40 are separated from the peeling layers 12 and bonded only to the temporary transfer substrate 26. The suitable manufacturing conditions for the above are similar to those of the first exemplary embodiment described above.

First Separation

Next, as shown in FIG. 7(*e*), the first substrate 10 is separated from the temporary transfer substrate 26. Thereafter, the thermal fusion-bonding sheet 30 including the thermal fusion-bonding adhesive is attached to the transfer origin bodies 40. Furthermore, the suitable manufacturing conditions for the above are similar to those of the first exemplary embodiment described above.

Second Bonding

Next, as shown in FIG. 8(*a*), the second substrate 32, to which the transfer origin bodies 40 including the semiconductor elements should be transferred, is mounted on the thermal fusion-bonding sheet 30 of the temporary transfer substrate 26. As shown in FIG. 8(*b*), the light irradiation is selectively performed only to areas of the transfer origin bodies 40 to be transferred from the temporary transfer substrate 26 side, so that only the transfer origin bodies 40 to be transferred are bonded to the second substrate 32. Furthermore, the suitable manufacturing conditions for the above are similar to those of the first exemplary embodiment described above.

Second Separation

Next, the temporary transfer substrate 26 is separated from the second substrate 32, by applying external force to the temporary transfer substrate 26 and the second substrate 32 in a direction in which both of the temporary transfer substrate and the second substrate are spaced apart from each other. As a result, as shown in FIG. 8(*c*), the transfer origin bodies 40 are transferred to at desired positions on the second substrate 32.

The transfer origin bodies 40 remain on the temporary transfer substrate 26. Thereafter, by repeating the second bonding and the second separation, the transfer origin bodies 40 can be transferred to other positions on the second substrate 32 or desired positions on another second substrate 32. For example, when the manufacturing method according to this exemplary embodiment is applied to manufacturing an active matrix substrate used for an electro-optical device (a liquid crystal display device or an EL display device), it is possible to efficiently dispersively arrange minute semiconductor elements, such as TFTs, etc. for every plural pixels on the substrate. Thus the manufacturing method according to this exemplary embodiment is suitable specifically to manufacture a large-sized electro-optical device.

Through the above, the plurality of transfer origin bodies 40 can be selectively transferred to the second substrate 32. Thereafter, the respective semiconductor elements or unit circuits included in the transfer origin bodies 40 accomplish electrical connections between the elements or electrical connections to interconnections previously provided on the second substrate 32 through the interconnections formed using various methods, such as an ink jet coating method, etc.

In this way, the manufacturing method according to this exemplary embodiment has the operational advantages similar to the first exemplary embodiment. In addition, by employing the selective element transfer, the respective semiconductor elements formed intensively (with a high density) on the first substrate can be dispersively transferred to desired positions on the second substrate. Therefore, the area efficiency in manufacturing the elements can be largely enhanced, so that the manufacturing cost can be reduced.

Figure 9:
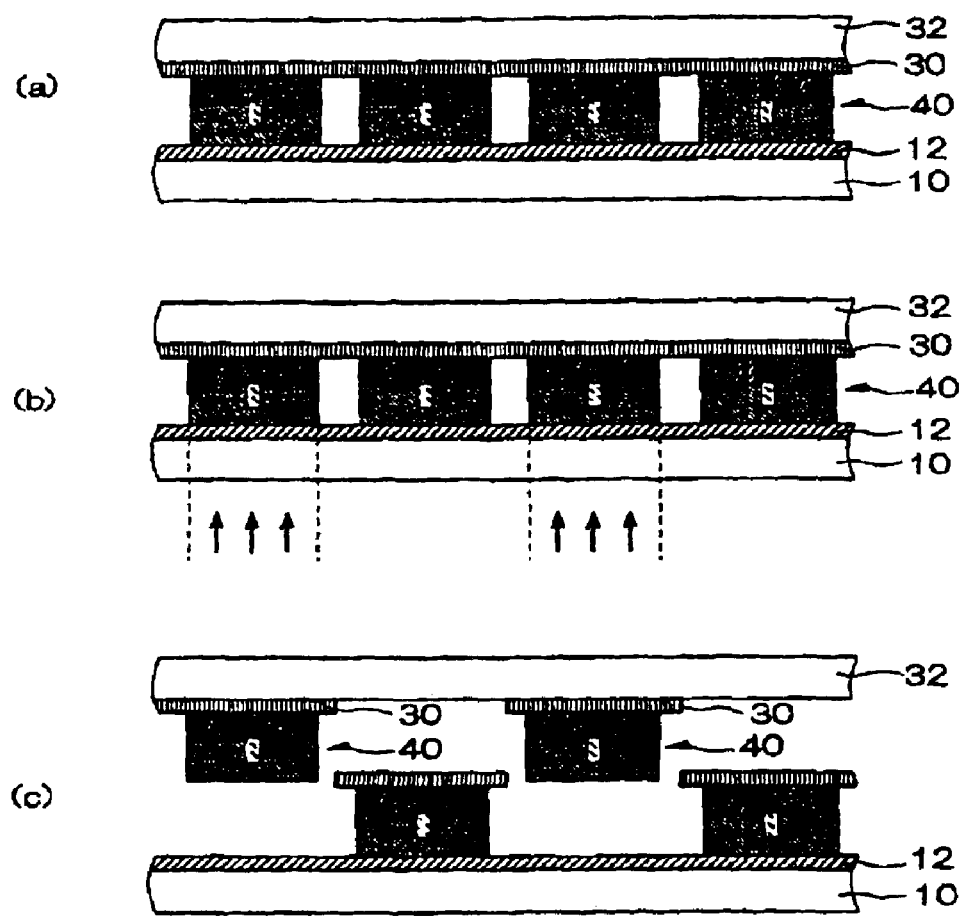
FIGS. 9(a)–9(c) are schematics illustrating a method of manufacturing a semiconductor device according to a modified example of the second exemplary embodiment.

The transfer of the semiconductor elements (the transfer origin bodies) may be performed directly from the first substrate 10 to the second substrate 32 without using the temporary transfer substrate 26. FIG. 9 is a schematic illustrating a manufacturing method in this case. After the transfer origin bodies 40 including the semiconductor elements are formed similarly to the aforementioned forming the element, as shown in FIG. 9(a), the transfer origin bodies 40 are bonded to the second substrate 32 through the thermal fusion-bonding sheet 30. Next, as shown in FIG. 9(b), the application of energy is carried out to the bonded body of the first substrate 10 and the second substrate 32 by the selective light irradiation to the peeling layer 12 from a back side of the first substrate 10, so that the peeling is caused at the inside and/or the boundary of the peeling layer 12 in the areas corresponding to the transfer origin bodies 40 to be transferred. As a result, as shown in FIG. 9(c), the desired transfer origin bodies 40 are separated from the peeling layers 12, and transferred to the second substrate 32. In this manufacturing method, the upper and lower structural relationship of the semiconductor elements included in the transfer origin bodies 40 are inverted to each other between the first substrate 10 and the second substrate 32, but there is an advantage that the processes can be simplified.

Third Exemplary Embodiment

A third exemplary embodiment of the present invention relates to an electro-optical device including the semiconductor device manufactured by using the method of manufacturing a semiconductor device according to an aspect of the present invention. An organic EL (Electroluminescence) display device is described as an example of the electro-optical device.

Figure 10:
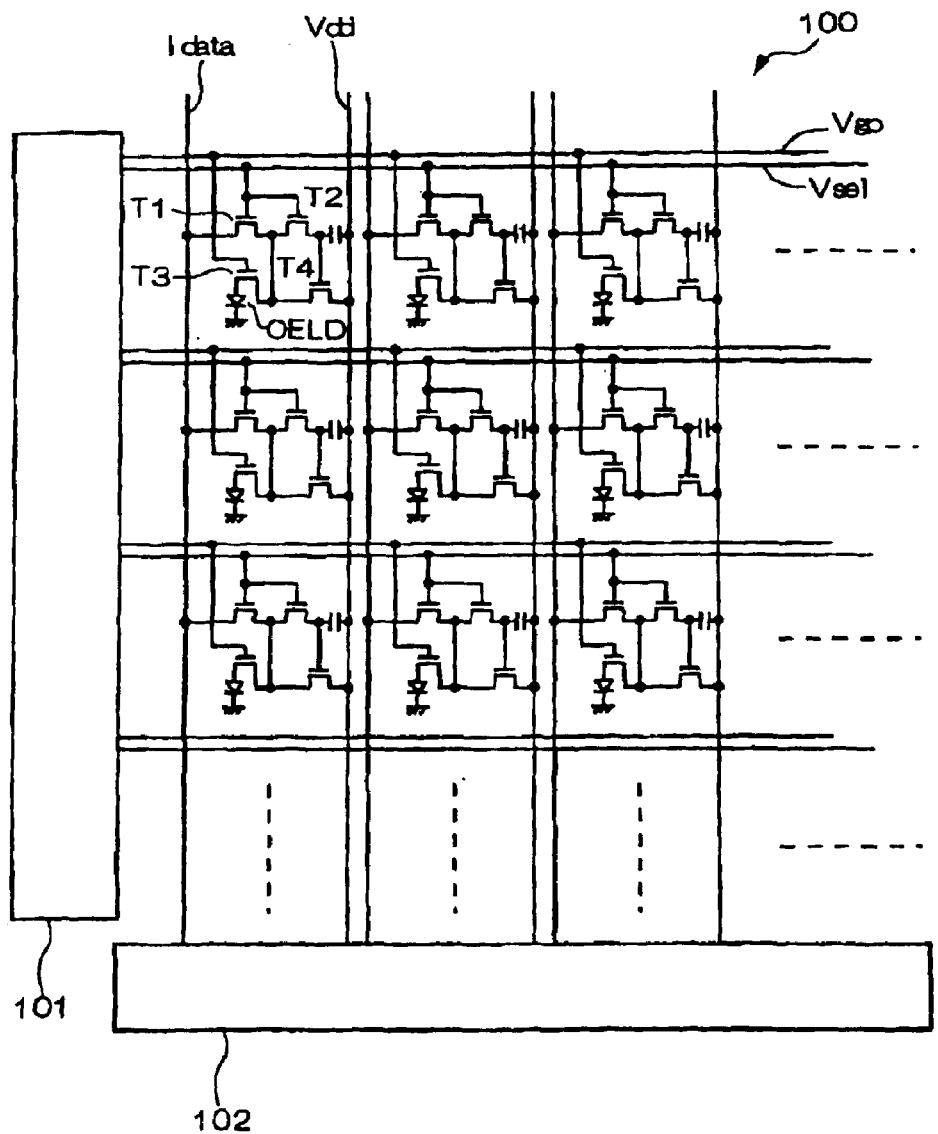
FIG. 10 is a schematic illustrating a configuration of an electro-optical device according to a third exemplary embodiment.

FIG. 10 is a schematic illustrating a configuration of an electro-optical device 100 according to the third exemplary embodiment. The electro-optical device 100 (display device) according to this exemplary embodiment includes a circuit board (active matrix substrate) obtained by arranging pixel driving circuits including thin film transistors T1 to T4 on a substrate in a matrix shape, light emitting layers OELD being driven and emitting light by the pixel driving circuits, and drivers 101 and 102 to supply driving signals to the pixel driving circuits including the respective thin film transistors T1 to T4. The driver 101 supplies driving signals to the respective pixel areas through scanning lines Vsel and light-emission control lines Vgp. The driver 102 supplies driving signals to the respective pixel areas through data lines Idata and power source lines Vdd. By controlling the scanning lines Vsel and the data lines Idata, current programming is performed to the respective pixel areas. Thus the light emission from the light emitting layers OELD can be controlled. The thin film transistors T1 to T4 and the drivers 101, 102 constituting the pixel driving circuits are formed by using the manufacturing method according to the first or second exemplary embodiment described above.

Although an organic EL display device has been described as an example of the electro-optical device, various electro-optical devices, such as liquid crystal display devices, etc. in addition thereto can be manufactured similarly.

Figure 11:
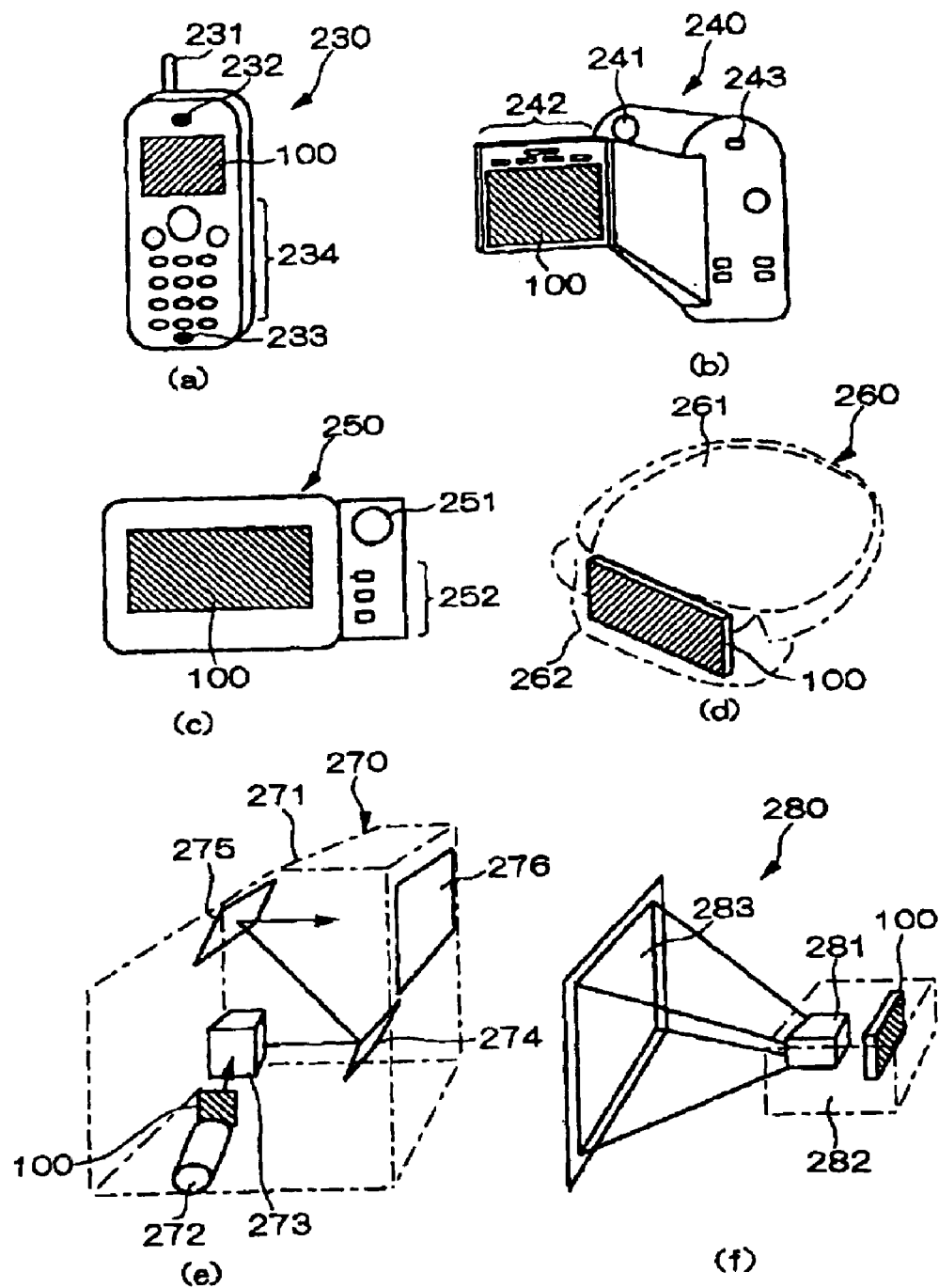
FIG. 11 is a schematic illustrating an example of an electronic apparatus to which the electro-optical device can be applied.

Next, various electronic apparatus including the electro-optical device 100 according to an aspect of the present invention will be described. FIG. 11 is a schematic illustrating examples of the electronic apparatus to which the electro-optical device 100 can be applied. FIG. 11(a) shows an example applied to a portable phone, where the portable phone 230 includes an antenna unit 231, a voice output unit 232, a voice input unit 233, a manipulation unit 234, and the electro-optical device 100 according to an aspect of the present invention. In this way, the electro-optical device according to an aspect of the present invention can be used as a display unit. FIG. 11(b) shows an example applied to a video camera, where the video camera 240 includes an image receiving unit 241, a manipulation unit 242, a voice input unit 243, and the electro-optical device 100 according to an aspect of the present invention. In this way, the electro-optical device according to an aspect of the present invention can be used as a finder or a display unit. FIG. 11(c) shows an example applied to a portable personal computer (so-called PDA), where the computer 250 includes a camera unit 251, a manipulation unit 252, and the electro-optical device 100 according to an aspect of the present invention. In this way, the electro-optical device according to an aspect of the present invention can be used as a display unit.

FIG. 11(d) shows an example applied to a head mount display, where the head mount display 260 includes a band 261, an optical system receiving unit 262, and the electro-optical device 100 according to an aspect of the present invention. In this way, the electro-optical device according to an aspect of the present invention can be used as an image display source. FIG. 11(e) shows an example applied to a rear type projector, where the projector 270 includes a light source 272, a synthesized optical system 273, mirrors 274, 275, a screen 276, and the electro-optical device 100 according to an aspect of the present invention, in a case 271. In this way, the electro-optical device according to an aspect of the present invention can be used as an image display source. FIG. 11(f) shows an example applied to a front type projector, where the projector 280 includes an optical system 281 and the electro-optical device 100 according to an aspect of the present invention in a case 282, and an image can be displayed on a screen 283. In this way, the electro-optical device according to an aspect of the present invention can be used as an image display source.

Furthermore, the electro-optical device 100 according to an aspect of the present invention is not limited to the examples described above, but may be applied to all the types of electronic apparatus employing a display device, such as an organic EL display device, a liquid crystal display device, etc. In addition to the above apparatus, the electro-optical device may be applied to, for example, a facsimile apparatus with a display function, a finder of a digital camera, a portable television, an electronic pocket book, an electric bulletin board, a propaganda announcement display, etc.

Fourth Exemplary Embodiment

The manufacturing methods according to the aforementioned exemplary embodiments can be applied to manufacturing various devices in addition to the electro-optical device. For example, various memories, such as a FeRAM (Ferro-electric RAM), a SRAM, a DRAM, a NOR-type RAM, NAND-type RAM, a non-volatile memory of a floating gate type, a magnetic RAM (MRAM), etc. can be manufactured by using the above manufacturing methods according to an aspect of the present invention. Furthermore, in a non-contact type communication system using a microwave, an aspect of the present invention can be applied to manufacturing an inexpensive tag equipped with a minute circuit chip (IC chip).

The present invention is not limited to the descriptions of the aforementioned exemplary embodiments, but various changes and modifications may be made thereto. For example, although a silicon film has been adopted and explained as an example of the semiconductor film in the aforementioned exemplary embodiments, the semiconductor film is not limited to this. Furthermore, although a thin film transistor has been adopted and explained as an example of the semiconductor element formed using the crystalline semiconductor film according to an aspect of the present invention in the aforementioned exemplary embodiments, the semiconductor element is not limited to this, but may be include other elements (for example, thin film diode, etc.).

What is claimed is:

1. A method of manufacturing a semiconductor device, comprising:
   forming a peeling layer on a first substrate;
   forming an insulating film on the peeling layer;
   forming a plurality of fine holes in the insulating film;
   forming a semiconductor film on the insulating film and in the fine holes;
   melting and crystallizing the semiconductor film by a heat treatment to form a crystalline semiconductor film including substantially single-crystalline grains substantially centered on the respective fine holes;
   forming a semiconductor element by using the crystalline semiconductor film; and
   causing peeling at an inside and/or a boundary surface of the peeling layer to separate the semiconductor element from the first substrate and transferring the semiconductor element to a second substrate.

2. The method of manufacturing a semiconductor device according to claim 1, the causing peeling comprises:
   bonding the semiconductor element on the first substrate to the second substrate;
   applying energy to the peeling layer to cause the peeling at the inside and/or the boundary surface of the peeling layer; and
   separating the first substrate from the second substrate.

3. The method of manufacturing a semiconductor device according to claim 1, the causing peeling comprises:
   bonding the semiconductor element on the first substrate to a temporary transfer substrate;
   causing the peeling at the inside and/or the boundary surface of the peeling layer;
   separating the first substrate from the temporary transfer substrate;
   bonding the semiconductor element on the temporary transfer substrate to the second substrate; and
   separating the temporary transfer substrate from the second substrate.

4. The method of manufacturing a semiconductor device according to claim 2, the application of energy to the peeling layer carried out by laser irradiation.

5. The method of manufacturing a semiconductor device according to claim 1, the first substrate having at least one of size, shape and thermal resistance suitable for a semiconductor process capable of processing at least a semiconductor wafer.

6. The method of manufacturing a semiconductor device according to claim 5, the semiconductor process being an LSI manufacturing process.

7. The method of manufacturing a semiconductor device according to claim 5, the first substrate having a wafer size.

8. The method of manufacturing a semiconductor device according to claim 1, a surface roughness of the first substrate ranging from 10 $\mu$m to 30 $\mu$m.

9. The method of manufacturing a semiconductor device according to claim 1, in forming the semiconductor element, a plurality of the semiconductor elements formed using one crystalline semiconductor film.

10. The method of manufacturing a semiconductor device according to claim 9, the plurality of semiconductor elements constitute a unit circuit.

11. The method of manufacturing a semiconductor device according to claim 1, in the causing peeling, only semiconductor elements that are transfer targets among a plurality of semiconductor elements formed on the first substrate being selectively transferred from the first substrate to the second substrate.

12. The method of manufacturing a semiconductor device according to claim 11, in the causing peeling, the semiconductor elements that are the transfer targets are selected correspondingly to a plurality of crystalline semiconductor films, respectively.

13. The method of manufacturing a semiconductor device according to claim 12, the method further comprising:
    dividing the semiconductor elements and the peeling layer formed on the first substrate every crystalline semiconductor film.

14. An electro-optical device, comprising:
    the semiconductor device manufactured by using the method of manufacturing a semiconductor device according to claim 1.

15. An integrated circuit, comprising:
    the semiconductor device manufactured by using the method of manufacturing a semiconductor device according to claim 1.

16. A circuit board, comprising:
    the semiconductor device manufactured by using the method of manufacturing a semiconductor device according to claim 1.

17. An electronic apparatus, comprising:
    the semiconductor device manufactured by using the method of manufacturing a semiconductor device according to claim 1.

* * * * *